United States Patent
Freund et al.

[19]

[11] Patent Number: 5,989,932
[45] Date of Patent: Nov. 23, 1999

[54] METHOD AND APPARATUS FOR RETAINING AND RELEASING LASER BARS DURING A FACET COATING OPERATION

[75] Inventors: Joseph M. Freund, Fogelsville; George J. Przybylek, Douglasville; Dennis M. Romero, Allentown, all of Pa.

[73] Assignee: Lucent Technologies, Inc., Holmdel, N.J.

[21] Appl. No.: 09/123,520

[22] Filed: Jul. 28, 1998

[51] Int. Cl.[6] ................................................ H01L 21/00
[52] U.S. Cl. ........................... 438/29; 118/728; 118/729
[58] Field of Search .................................. 118/728, 729; 438/29

[56] References Cited

U.S. PATENT DOCUMENTS

| | | |
|---|---|---|
| 3,949,295 | 4/1976 | Moorshead . |
| 3,962,655 | 6/1976 | Selway et al. . |
| 4,195,758 | 4/1980 | Morgan . |
| 4,563,368 | 1/1986 | Tihanyi et al. . |
| 4,716,568 | 12/1987 | Scifres et al. . |
| 4,904,610 | 2/1990 | Shyr . |
| 5,063,173 | 11/1991 | Gasser et al. . |
| 5,084,886 | 1/1992 | Martin . |
| 5,099,488 | 3/1992 | Ahrabi et al. . |
| 5,154,333 | 10/1992 | Bauer et al. . |
| 5,171,717 | 12/1992 | Broom et al. . |
| 5,311,530 | 5/1994 | Wagner et al. . |
| 5,325,384 | 6/1994 | Herb et al. . |
| 5,394,426 | 2/1995 | Joslin . |
| 5,498,973 | 3/1996 | Cavaliere et al. . |
| 5,668,049 | 9/1997 | Chakrabarti et al. . |
| 5,719,077 | 2/1998 | Chakrabarti et al. . |

*Primary Examiner*—Richard Bueker
*Attorney, Agent, or Firm*—Dickstein Shapiro Morin & Oshinsky LLP

[57] ABSTRACT

An apparatus and process for retaining laser bars during a facet coating operation and releasing the bars after the conclusion of the facet coating operation. A multitude of spacers are positioned with laser bars therebetween. Each spacer includes an upper and lower fixture blade. The spacers are compressed together, thus sandwiching the laser bars, during the facet coating operation. After release of the compressive force, adhered laser bars are removed by moving one of the fixture blades relative to the other fixture blade. Movement can be along the longitudinal axis of the blades, perpendicular to the longitudinal axis, or rotation about a pivot axis. Further, movement can include elevation of one blade, or an end of one blade, relative to the other blade.

38 Claims, 6 Drawing Sheets

METHOD AND APPARATUS FOR RETAINING AND RELEASING LASER BARS DURING A FACET COATING OPERATION

FIELD OF THE INVENTION

The present invention relates generally to laser device fabrication, and more particularly, to an apparatus and process for retaining a laser bar during a facet coating operation and for releasing the laser bar thereafter.

BACKGROUND OF THE INVENTION

Semiconductor laser devices, such as double heterostructure laser diodes, are utilized in various applications, such as for optical sources in fiber optic communications. In the manufacture of such devices, double heterostructures are grown and processed on a wafer substrate by, for example, liquid phase epitaxy. The wafer is then cleaved into typically solid rectangular laser bars containing many laser diodes. The laser diodes are functional at the laser bar level, and therefore electrical testing is often performed at this level prior to dicing the individual laser diodes from the bars.

Each laser bar has two end faces, or facets, formed by cleaving during the cleaving process. Laser light is ultimately transmitted through the facets, so it is important for their surfaces to remain unperturbed and uncontaminated during handling of the laser bar. Following the cleaving operation on the wafer to form the laser bars, the facets are coated with an optical coating in a facet coating apparatus. A facet coat holding fixture is typically employed to retain the laser bar during the facet coating and also to transport the bar into and out of the facet coating apparatus.

FIGS. 1 and 2 illustrate a conventional facet coat holding fixture 10 for retaining a laser bar 20 during a facet coating operation. The fixture 10 includes a plurality of fixture blades 12. Each fixture blade 12 includes opposing sides 14, 16. A laser bar 20 is placed between a side 14 of one fixture blade 12 and a side 16 of another fixture blade 12. A compression device (not shown) provides a compressive force in the direction shown onto the fixture blades 12 such that the laser bars 20 are sandwiched therebetween.

Each laser bar 20 is a thin, solid rectangular bar having facets 26, 28 on opposing sides. Each laser bar 20 is of a small size. For example, typical dimensions of a laser bar 20 are on the order of 0.005 inches by 0.012 inches by 0.300 inches. Because of its small size, each laser bar 20 must be handled with care to avoid damaging it.

During the compression of the fixture blades 12, the flat side surfaces 14, 16 of two fixture blades 12 compress against two opposing non-facet sides of each laser bar 20. Once the compressive force is applied, the facets 26, 28 of the laser bars 20 can be coated.

After being transported outside of the facet coating apparatus, the compressive force is released from the fixture 10, thereby allowing separation of the laser bars 20 from the fixture blades 12. FIG. 2 shows an exaggerated separation of the fixture blades 12 for clarity of illustration.

Once a laser bar 20 becomes completely separated from a fixture blade 12, the laser bar 20 may be removed by way of a vacuum pick, robot arm, or other similar device for subsequent processing and testing operations.

One drawback to the facet coating operation is that optical coating applied to the facet surfaces 26, 28 of the laser bars 20 often seeps in between the non-facet surfaces of the laser bar 20 and the side surfaces 14, 16 of the fixture blades 12. The result of this seepage is that often, upon release of the compressive force from the fixture 10, a laser bar 20 will stick to one of the fixture blades 12, as shown for the middle laser bar 20 in FIG. 2.

If a laser bar 20 remains adhered to a fixture blade 12, an additional operation is then required to detach the laser bar 20 from the fixture blade 12. One example of such an additional operation includes manually shaking the fixture 10 to loosen the laser bar 20. Another example is physically prying the laser bar 20 from the fixture blade 12 with a pick or other similar device. Such operations result in a reduction in the yield of usable laser bars, since a number of the laser bars 20 become damaged when pried or shaken from the fixture blades 12. Typically, as many as half of the laser bars 20 may become damaged from these additional operations.

SUMMARY OF THE INVENTION

The problems of the prior art are overcome to a great extent by the present invention, which relates to a facet coat holding fixture which retains laser bars during a facet coating operation and which releases the laser bars without resulting damage to the bars. The facet coat holding fixture includes a plurality of spacers, between which are placed laser bars. Each spacer includes an upper and a lower fixture blade, each fixture blade being movable relative to its paired blade. A compression device provides a compressive force upon the plurality of spacers, thereby sandwiching the laser bars between pairs of spacers. The compression device sustains the compressive force on the spacers during the facet coating operation, and is adapted to remove the force after the facet coating operation.

In accordance with a preferred embodiment of the present invention, the facet coat holding fixture includes means for releasing any laser bars which have become adhered to the fixture blades. In one aspect, one of a pair of upper and lower fixture blades is moved relative to the other paired blade in a direction perpendicular to the longitudinal axis of the spacers. Optionally, one of the upper and lower fixture blades can then be moved in a second direction opposite from the original movement direction.

In another aspect of the present invention, one of the pairs of fixture blades is moved relative to the other paired blade in a direction along the longitudinal axis of the spacers. Optionally, one of the upper and lower fixture blades can then be moved in a second direction opposite from the original movement direction.

In another aspect of the present invention, one of a pair of upper and lower fixture blades is rotated in a direction about a pivot axis parallel to the longitudinal axis of the spacers. Optionally, one of the upper and lower fixture blades can then be rotated in a second direction about the pivot axis opposite from the original movement direction.

The foregoing and other advantages and features of the invention will be more readily understood from the following detailed description of the invention, which is provided in connection with the accompanying drawings.

DETAILED DESCRIPTION OF PREFERRED EMBODIMENTS

Figure 3:
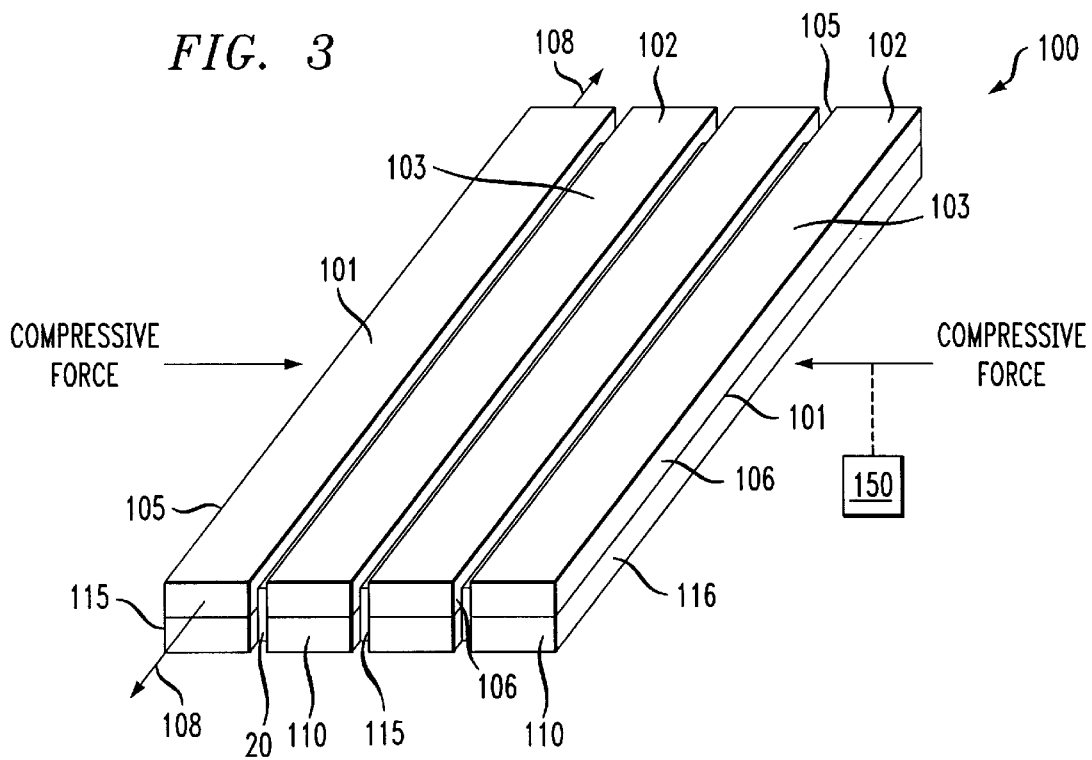
FIG. 3 is a perspective view of a facet coating apparatus constructed in accordance with a preferred embodiment of the present invention.

Referring now to FIGS. 3–10, a facet coat holding fixture 100 according to a preferred embodiment of the invention is shown. The facet coat holding fixture 100 includes a plurality of spacers 101. Each spacer 101 includes an upper fixture blade 102 and a lower fixture blade 110. Each of the upper fixture blades 102 is positioned directly above and resting upon each of the lower fixture blades 110. The upper fixture blades 102 each have a top surface 103, a bottom surface 104, a left side surface 105, and a right side surface 106. Each lower fixture blade 110 includes a top surface 113 which is in contact with the bottom surface 104 of the upper fixture blade 102, a bottom surface 114, a left side surface 115 contiguous with the left side surface 105 of the upper fixture blade 102, and a right surface 116 contiguous with the right side surface 106 of the upper fixture blade 102. Each of the fixture blades 102, 110 further has a longitudinal axis running parallel to the direction of line 108 as shown in FIG. 3.

A laser bar 20, having opposing facet surfaces 26, 28 is positioned between two pairs of upper and lower fixture blades 102, 110. A compression device 150, shown in schematic, provides a compressive force in the direction shown in FIG. 3 upon the fixture blades 102, 110 such that the laser bars 20 are sandwiched therebetween. It is to be understood that any compression device capable of providing, sustaining and removing a sufficient compressive force on the spacers 101 is suitable for the described invention.

Figure 1:
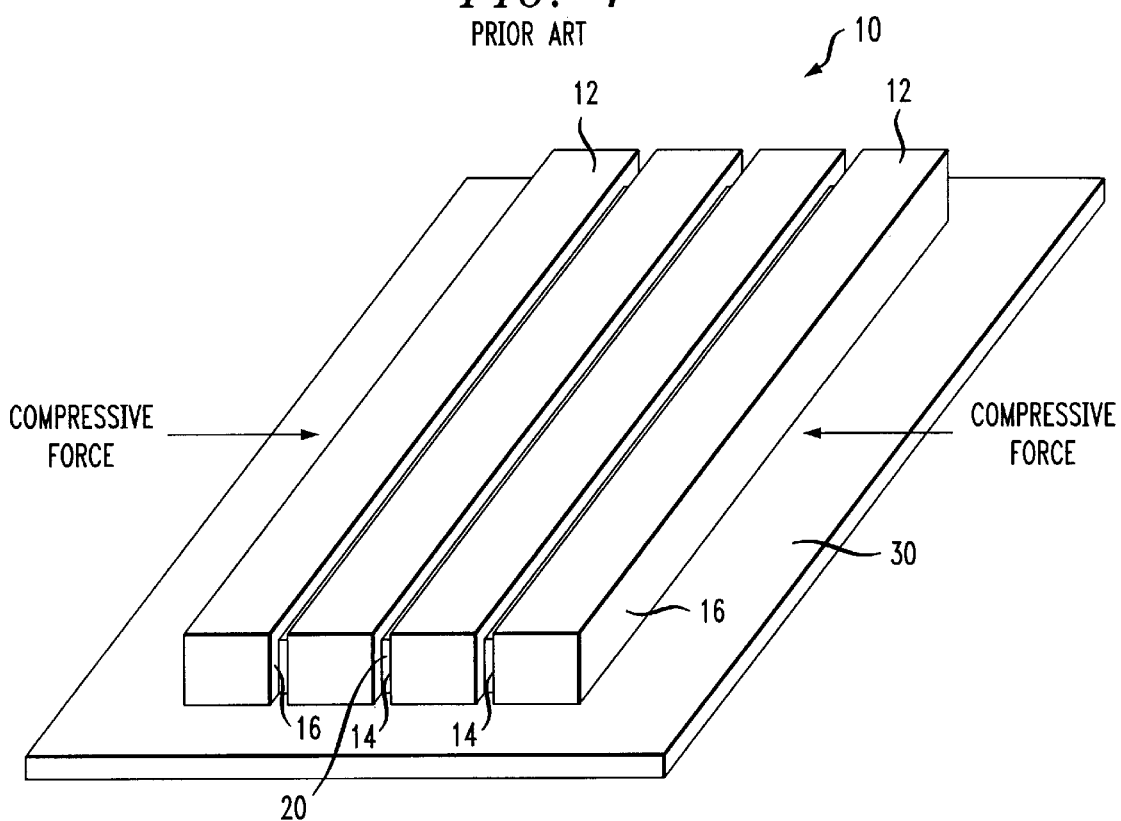
FIG. 1 is a perspective view of a conventional facet coating apparatus in a compressed state.
Figure 2:
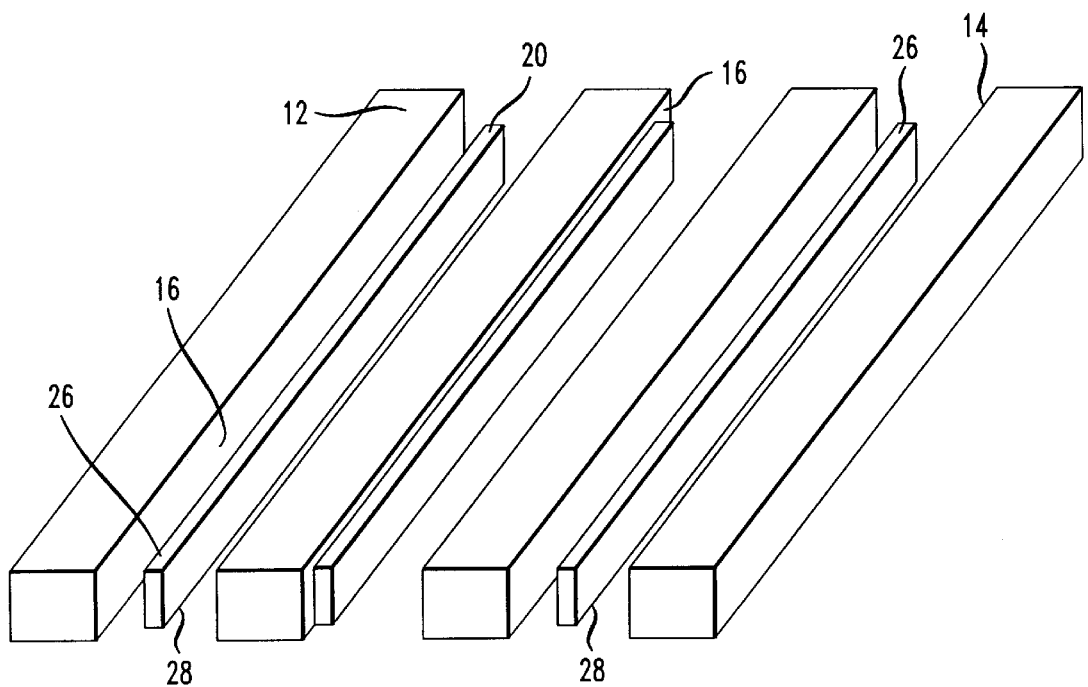
FIG. 2 is a perspective view of the conventional facet coating apparatus of FIG. 1 in an uncompressed state.
Figure 4:
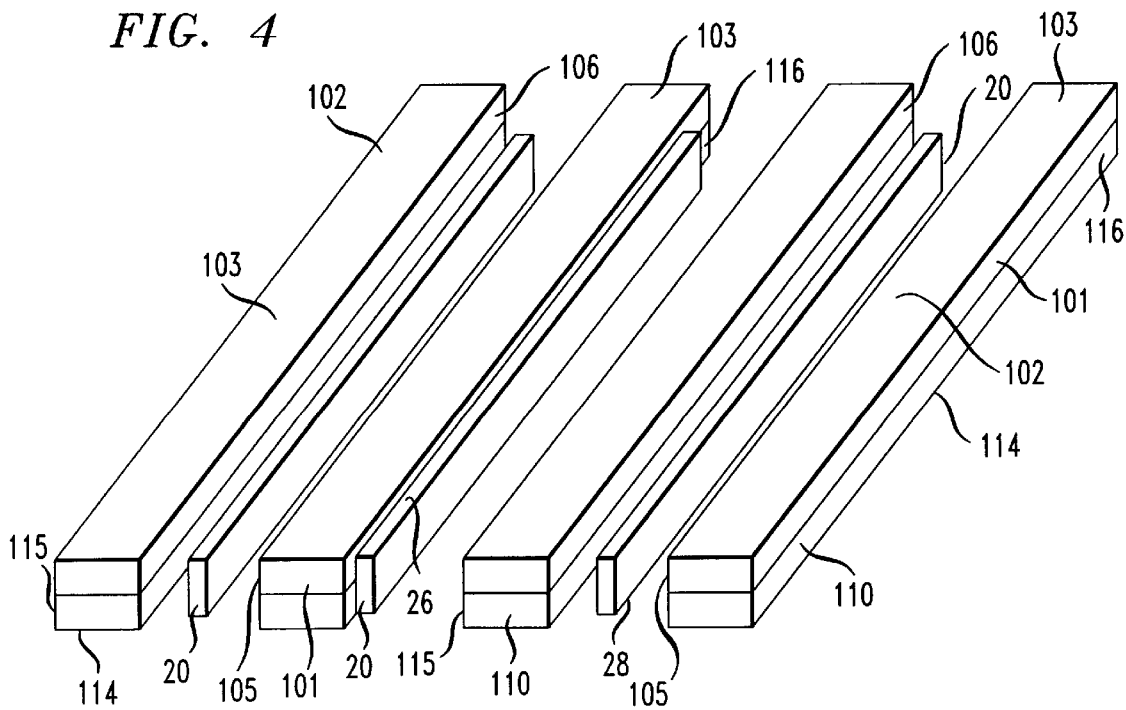
FIG. 4 is a perspective view of the facet coating apparatus of FIG. 3 shown in an uncompressed state.

After compression of the laser bars 20, the facet surfaces 26, 28 are coated with an optical coating. After the facet coating operation, the facet coat holding fixture 100 is transported from the facet coating apparatus by way of a receiving surface 30 (shown in FIG. 1). After transportation from the facet coating apparatus, the compressive force of the compression device is released, thereby removing the bias of each of the fixture blades 102, 110 toward the laser bars 20. For clarity of illustration, the separation between the laser bars 20 and the fixture blades 102, 110 has been exaggerated in FIGS. 4–10. As shown in FIG. 4, often times a laser bar 20 will remain adhered to a side of the fixture blades 102, 110. Specifically, with reference to FIG. 4, the second laser bar 20 from the left remains adhered to sides 106 and 116 of, respectively, an upper fixture blade 102 and a lower fixture blade 110

Figure 5:
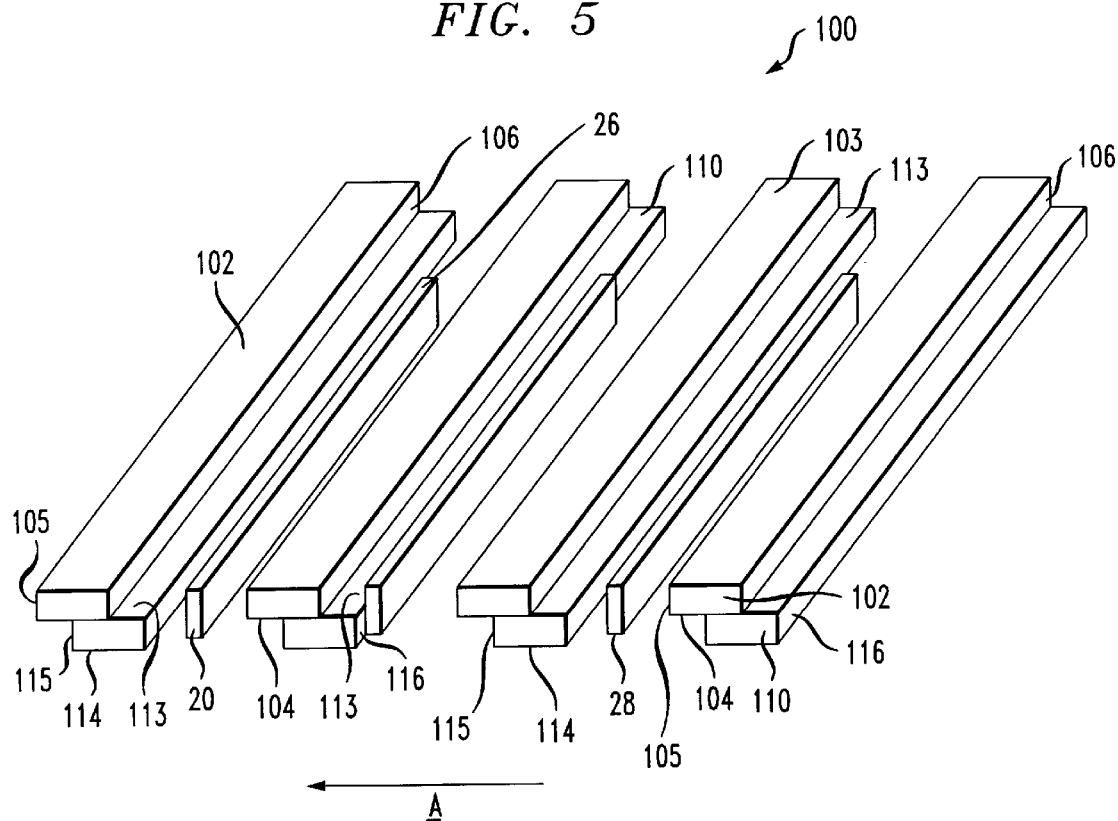
FIG. 5 is a perspective view of the facet coating apparatus of FIG. 4 showing the upper fixture blades shifted in a direction A relative to the lower fixture blades.
Figure 6:
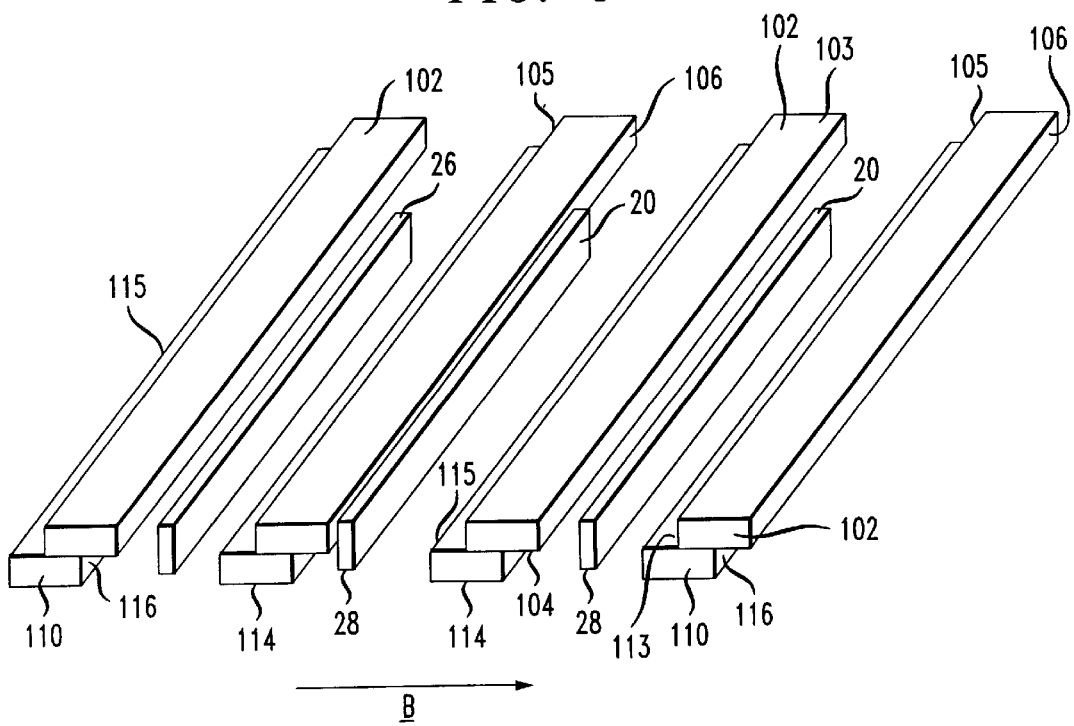
FIG. 6 is a perspective view of the facet coating apparatus of FIG. 4 showing the upper fixture blades shifted in a direction B relative to the lower fixture blades.

With reference to FIGS. 5–6, a method is illustrated for breaking the adherence of a laser bar 20 from the fixture blades 102, 110. In specific reference to FIG. 5, the upper fixture blades 102 are moved in a direction A relative to the lower fixture blades 110. In this manner, the adherence of the laser bar 20 to side 106 of the upper fixture blade 102 is broken. With specific reference to FIG. 6, next the upper fixture blades 102 are moved in a direction B relative to the lower fixture blades 110. In this manner, the adherence of the laser bar 20 is broken from the side 116 of the lower fixture blade 110. By this method, the laser bar 20 is separated from the fixture blades 102, 110 without resulting damage to the laser bar 20. While the method of FIGS. 5–6 is described in terms of moving the upper fixture blades 102, it is to be understood as being within the scope of the invention that instead the lower fixture blades 110 can be moved. Further, it is to be understood as being within the scope of the invention that the upper and lower fixture blades 102, 110 can be simultaneously moved in opposite directions A, B. If, for example, upper fixture blade 102 moves in the direction A while lower fixture blade 110 moves in the direction B, the laser bar 20 may yet remain adhered to one of the fixture blades 102, 110. Thus, it is also to be understood as being within the scope of the present invention that the upper fixture blade 102 would then move in the direction B while lower fixture blade 110 moves in the direction A to break the adherence of the laser bar 20.

Figure 7:
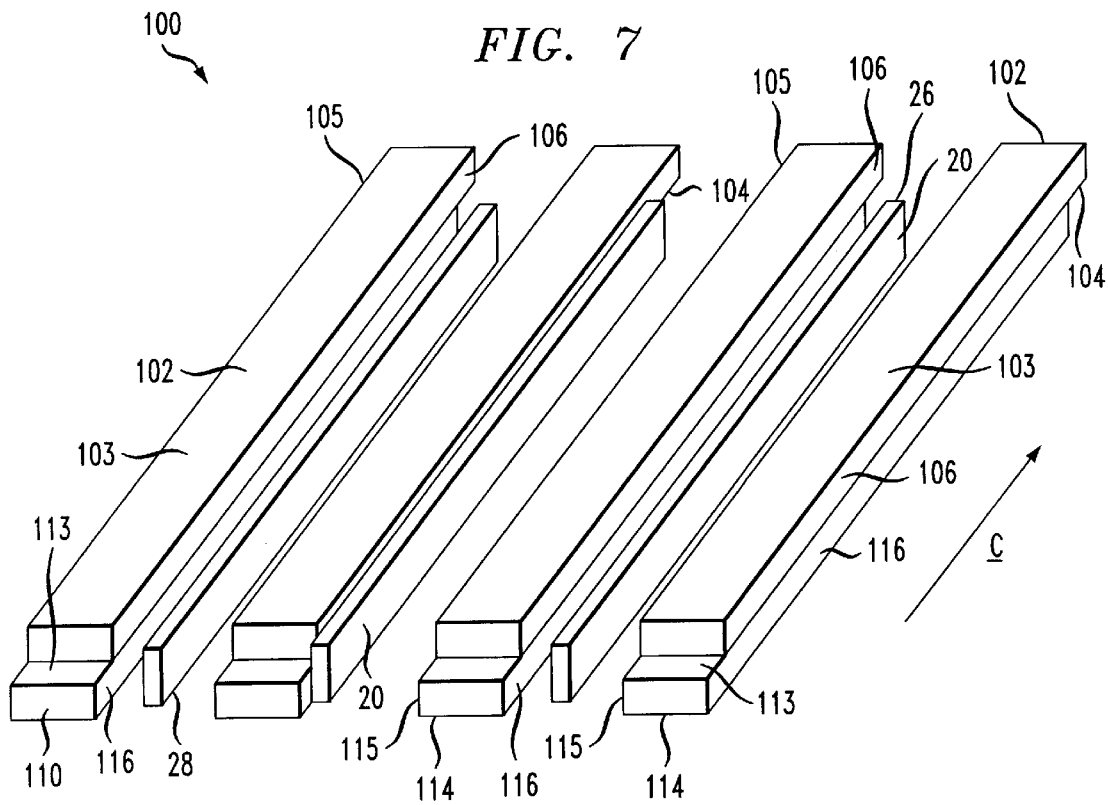
FIG. 7 is a perspective view of the facet coating apparatus of FIG. 4 showing the upper fixture blades shifted in a direction C relative to the lower fixture blades.
Figure 8:
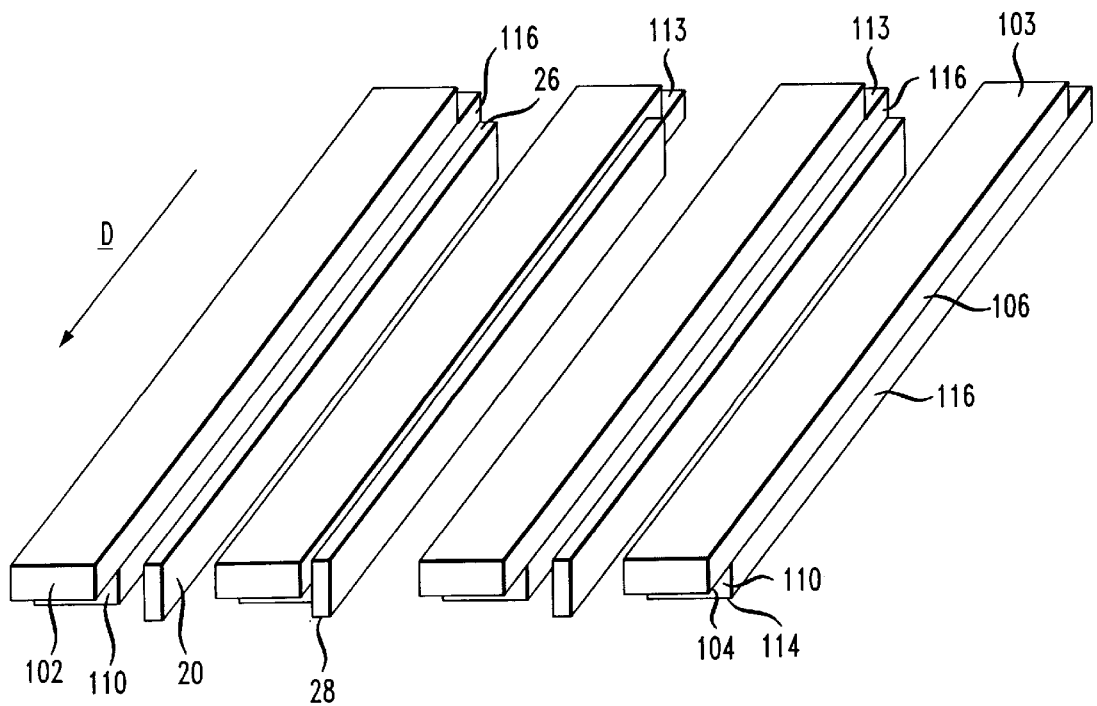
FIG. 8 is a perspective view of the facet coating apparatus of FIG. 4 showing the upper fixture blades shifted in a direction D relative to the lower fixture blades.

With reference to FIGS. 7–8, an alternative method for breaking the adherence of the laser bars 20 from the fixture blades 102, 110 is illustrated. Specifically with reference to FIG. 7, the upper fixture blades 102 are moved in a direction C relative to the lower fixture blades 110. Through this movement, a shear force is directed upon the laser bar 20 which is adhered to the upper and lower fixture blades 102, 110. This shear force will tend to break the adherence of the laser bar 20 to the sides 106, 116 of the fixture blades 102, 110 without resulting in damage to the laser bar 20. With reference to FIG. 8, the upper fixture blades 102 may optionally be moved in a direction D relative to the lower fixture blades 110. This movement would be necessary in the event that the shear force directed on the laser bars 20 from the movement of the upper fixture blades 102 in direction C was unsuccessful in breaking the adherence. While the method of FIGS. 7–8 is described in terms of moving the upper fixture blades 102, it is to be understood as being within the scope of the invention that instead the lower fixture blades 110 can be moved. Further, it is to be understood as being within the scope of the invention that the upper and lower fixture blades 102, 110 can be moved in opposite directions C, D at the same time to direct the shear force on the laser bar 20. If, for example, upper fixture blade 102 moves in the direction C while lower fixture blade 110 moves in the direction D, the laser bar 20 may yet remain adhered to one of the fixture blades 102, 110. Thus, it is also to be understood as being within the scope of the present invention that the upper fixture blade 102 would then move in the direction D while lower fixture blade 110 moves in the direction C to break the adherence of the laser bar 20.

Figure 9:
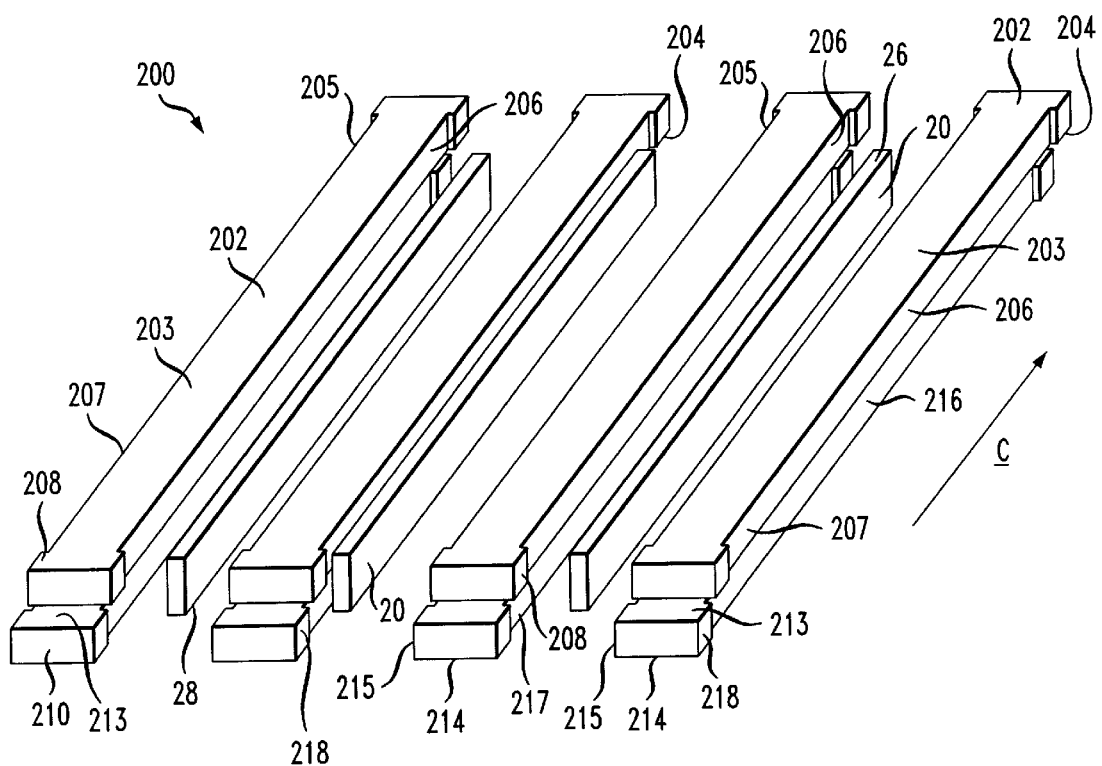
FIG. 9 is a perspective view of a facet coating apparatus constructed in accordance with another preferred embodiment of the present invention showing the upper fixture blades shifted in a direction C relative to the lower fixture blades.

Another preferred embodiment of the present invention is illustrated in FIG. 9. As shown, a facet coat holding fixture 200 includes an upper fixture blade 202 and a lower fixture blade 210. The facet coat holding fixture 200 differs from the facet coat holding fixture 100 in that the fixture blades 202, 210 are not rectangular like the fixture blades 102,110. Instead, the fixture blades 202 have cutout portions 207 along the sides 205,206, defining shoulders 208. Likewise, the fixture blades 210 have cutout portions 217 along the sides 215, 216, defining shoulders 218.

The shoulders 208, 218 are of such size and configuration as to prevent the adhered laser bars 20 from sliding in the directions C, D when the upper fixture blades 202 are moved in such directions. Instead, the adhered laser bars 20 are caught by the shoulders 208, 218, thus assisting in removing the adherence of the laser bars 20 from the fixture blades 202, 210.

Figure 10:
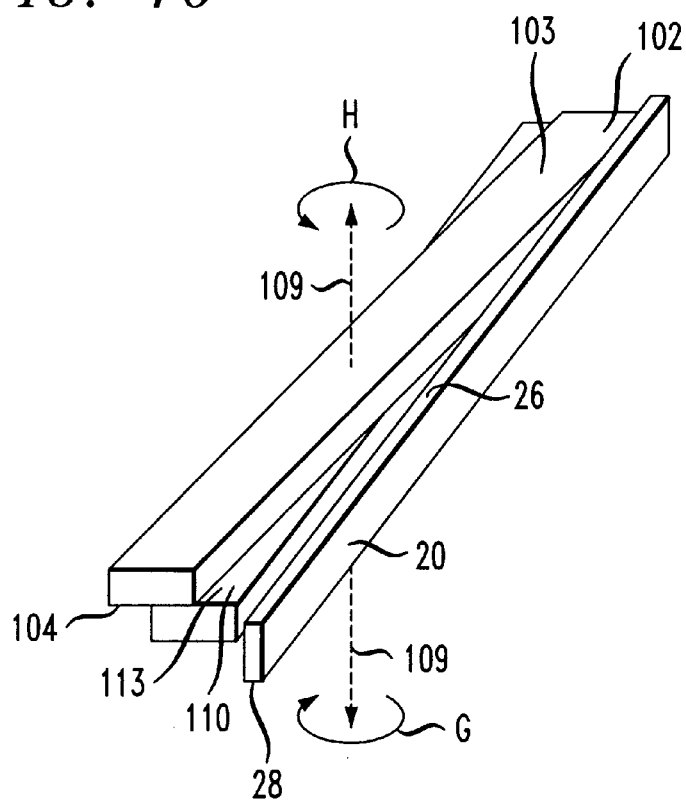
FIG. 10 is a perspective view of one pair of fixture blades of the facet coating apparatus of FIG. 4 showing the upper fixture blades rotated relative to the lower fixture blades.

With reference to FIG. 10, another method for releasing the adherence of the laser bars 20 from the sides of the fixture blades 102, 110 is illustrated. Specifically, the upper fixture blades 102 are rotated in a direction G about a pivot axis 109 such that the bottom surfaces 104 of the upper fixture blades 102 slide along the top surfaces 113 of the bottom fixture blades 110. In this manner, side 106 pushes against one of the non-facet sides of the laser bar 20, thereby breaking the adherence of the laser bar 20 from the sides 106, 116 of the upper and lower fixture blades 102, 110. Alternatively, the upper fixture blades 102 may be rotated about the pivot axis 109 in a direction H.

While the method of FIG. 10 is described in terms of rotating the upper fixture blades 102, it is to be understood as being within the scope of the invention that either the lower fixture blades 110, or both fixture blades 102, 110 can be rotated. Specifically, the lower fixture blades 110 may be rotated in the direction H about the pivot axis 109. Alternatively, the lower fixture blades 110 may be rotated in the direction G about the pivot axis 109. Further, the upper fixture blades 102 and the lower fixture blades 110 may be rotated in opposite directions of, respectively, G and H, about the pivot axis 109. Also, the upper fixture blades 102 and the lower fixture blades 110 may be rotated in opposite directions of, respectively, H and G, about the pivot axis 109.

Figure 11:
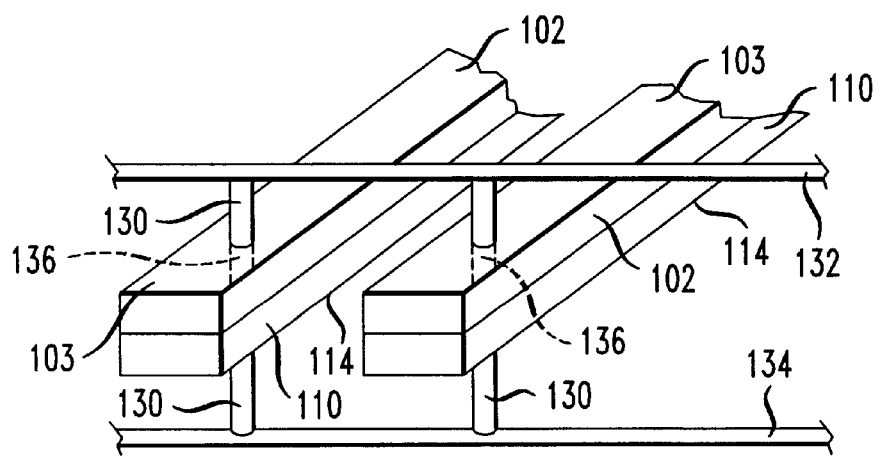
FIG. 11 is a partial perspective view of the facet coating apparatus of FIG. 4 showing a moving mechanism constructed in accordance with a preferred embodiment of the present invention.

Referring to FIG. 11, a preferred embodiment of a device used to move the fixture blades 102, 110 relative to one another is illustrated. Specifically, a pair of lever bars 132, 134 are shown. The lever bars 132, 134 are essentially identical except for the positioning, one such lever bar 132 being positioned vertically above the other lever bar 134 and above the top surface 103 of the upper fixture blade 102. The other lever bar 134 is positioned vertically below the bottom surface 114 of the lower fixture blade 110. A plurality of pins 130 extend out from the lever bars 132, 134. Each pin 130 of the upper lever bar 132 is to mate with the top surfaces 103 of the upper fixture blades 102. Each pin 130 of the lower lever bar 134 is to mate with the bottom surfaces 114 of the lower fixture blades 110. Specifically, a pin 130 mates with a hole 136, which is drilled or otherwise created in the surfaces 103, 114 of the fixture blades 102, 110. As shown in FIG. 11, the lower lever bar 134 is moved in the direction A, which moves the fixtures blades 110 in the direction A. The upper lever bar 132 is moved in the direction B, moving the fixture blades 102 in the direction B.

It is to be understood that the lever bars 132, 134 may be moved in the directions A, B, or C, D, or G, H. For example, with reference to FIGS. 5, 6 and 11, the lever bars 132, 134 may be moved in the directions A, B. Specifically, the upper lever bar 132 may be moved in a direction A, moving the upper fixture blades 102 in that direction. Alternatively, the lower lever bar 134 may be moved in the direction B, moving the lower fixture blades 110 in that direction. Furthermore, the lever bars 132, 134 can be moved in the opposite directions A, B simultaneously, and if necessary, the lever bars 132, 134 can reverse their course (the upper lever bar 132 can move in the direction B and the lower lever bar 134 can move in the direction A) to break the adherence of the laser bar 20.

Further, with reference to FIGS. 7, 8, 9 and 11, the lever bars 132, 134 may be moved in the directions C, D. Specifically, the upper lever bar 132 may be moved in a direction C, moving the upper fixture blades 102 in that direction. Alternatively, the lower lever bar 134 may be moved in the direction D, moving the lower fixture blades 110 in that direction. Furthermore, the lever bars 132, 134 can be moved in the opposite directions C, D simultaneously, and if necessary, the lever bars 132, 134 can reverse their course (the upper lever bar 132 can move in the direction D and the lower lever bar 134 can move in the direction C) to break the adherence of the laser bar 20.

With reference to FIGS. 10 and 11, the movement of the lever bars 132, 134 may also be in the directions G, H. However, in order to obtain rotational movement of the fixture blades 102, 110, the setup of the lever bars 132 must be able to accommodate such movement. As with the other described embodiments, the lever bars 132, 134 can each be moved in either of the two directions G, H, either individually or in opposite directions concurrently. It is to be understood that any suitable configuration allowing movement of the fixture blades 102, 110 in the directions G, H is within the scope of the invention.

The above description and drawings are only illustrative of certain preferred versions which achieve the objects, features and advantages of the present invention. It is not intended that the present invention be limited to these versions. For example, although it is described that all of the upper fixture blades 102 are moved relative to the lower fixture blades 110, it is to be understood that movement of less than all of the upper fixture blades 102 relative to the lower fixture blades 110 is to be within the scope of the invention. For example, if a single laser bar 20 is adhered to the sides of the fixture blades 102, 110, it is to be understood that the movement of a singular upper fixture blade 102 relative to the lower fixture blades 110, or the movement of a single lower fixture blade 110 relative to the upper fixture blades 102, or the movement in opposing directions of a single pair of fixture blades 102, 110 is to be within the scope of the present invention. Furthermore, while the moving mechanism described includes a pair of lever bars with extending pins, it is to be understood that the present invention is not so limited. Any suitable device capable of moving stacked fixture blades relative to one another is within the scope of the present invention. Specifically, instead of lever bars and pins, a pair of comb-like devices could be utilized, with the comb teeth mating with corresponding orifices in the fixture blades. Alternatively, the fixture blades may be adapted at the ends 107, 117 to accept a clamp or other holding device, and the clamps may be joined together in such a way as to allow simultaneous movement of either the upper or lower fixture blades 102, 110.

What is claimed as new and desired to be protected by a Letters Patent of the United States:

1. An apparatus for retaining at least one laser bar during a facet coating operation, comprising:
   a plurality of spacers, each said spacer including an upper fixture blade positioned above and movable relative to a lower fixture blade, wherein the at least one laser bar is placed between any two of said plurality of spacers;

a compression device adapted to apply a compressive force on each laser bar through said plurality of spacers, thereby retaining each laser bar during the facet coating operation, said compression device further adapted to remove the compressive force after the facet coating operation.

2. The apparatus of claim 1, further comprising a device adapted to move at least one of said upper and lower fixture blades of a spacer relative to the other, thereby releasing any adhered laser bar.

3. The apparatus of claim 2, wherein said movement includes a first movement of said at least one of said blades in a first direction along a longitudinal axis of said blades.

4. The apparatus of claim 3, wherein said movement includes a second movement of said at least one of said blades in a second direction opposite said first direction.

5. The apparatus of claim 3, wherein said first movement moves at least one of said upper fixture blades, said second movement moves at least one of said lower fixture blades, said first and second movements being performed concurrently.

6. The apparatus of claim 2, wherein said movement includes a first movement of said at least one of said blades in a first direction perpendicular to a longitudinal axis of said blades.

7. The apparatus of claim 6, wherein said movement includes a second movement of said at least one of said blades in a second direction opposite said first direction.

8. The apparatus of claim 7, wherein said first movement moves at least one of said upper fixture blades, said second movement moves at least one of said lower fixture blades, said first and second movements being performed concurrently.

9. The apparatus of claim 2, wherein said at least one of said blades is rotated about a pivot axis.

10. The apparatus of claim 2, wherein said device moves at least one of said upper blades.

11. A method for retaining at least one laser bar during a facet coating operation, comprising the steps of:

providing a plurality of spacers, each said spacer including an upper fixture blade positioned above and movable relative to a lower fixture blade;

placing the at least one laser bar between any two of said plurality of spacers;

exerting a force on said plurality of spacers so as to bias said any two of said plurality of spacers toward the at least one laser bar;

providing a coat upon at least one side of the at least one laser bar; and removing said force from said plurality of spacers.

12. The method of claim 11, further comprising a step of releasing any of the at least one laser bar which is adhered to any of said blades, said releasing step including moving at least one of said blades of a spacer relative to the other of said blades of a spacer.

13. The method of claim 12, wherein said movement includes a first movement of said at least one of said blades in a first direction along a longitudinal axis of said blades.

14. The method of claim 13, wherein said movement includes a second movement of said at least one of said blades in a second direction opposite said first direction.

15. The method of claim 14, wherein said first movement moves at least one of said upper fixture blades, said second movement moves at least one of said lower fixture blades, said first and second movements being performed concurrently.

16. The method of claim 12, wherein said movement includes a first movement of said at least one of said blades in a first direction perpendicular to a longitudinal axis of said blades.

17. The method of claim 16, wherein said movement includes a second movement of said at least one of said blades in a second direction opposite said first direction.

18. The method of claim 17, wherein said first movement moves at least one of said upper fixture blades, said second movement moves at least one of said lower fixture blades, said first and second movements being performed concurrently.

19. The method of claim 16, wherein said movement in said first direction includes elevating at least one of said upper blades relative to said lower blades.

20. The method of claim 16, wherein said movement in said first direction includes elevating one end of at least one of said upper blades relative to said lower blades.

21. The method of claim 12, wherein said movement includes rotating said at least one of said blades about a pivot axis located on a side of said at least one of said blades.

22. The method of claim 12, wherein at least one of said upper blades is moved relative to said lower blades.

23. An apparatus for releasing an adhered laser bar subsequent to a facet coating operation, comprising:

a plurality of spacers, each said spacer including an upper fixture blade positioned above and movable relative to a lower fixture blade, wherein the adhered laser bar is positioned between any two of said plurality of spacers and adhered to at least one of said spacers, each said fixture blade including an opening; and two lever bars, one of said lever bars positioned over said upper fixture blades and the other of said lever bars positioned under said lower fixture blades, each said lever bar including a plurality of pins, each of said pins mating with each of said openings, wherein a first movement of one of said lever bars in a first direction moves at least one of said fixture blades in said first direction.

24. The apparatus of claim 23, wherein said first direction is along a longitudinal axis of said fixture blades.

25. The apparatus of claim 24, wherein the other of said lever bars is moved in a second direction opposite said first direction.

26. The apparatus of claim 25, wherein said upper fixture blades are moved in said first direction, said lower fixture blades are moved in said second direction, said movements occurring concurrently.

27. The apparatus of claim 23, wherein said first direction is perpendicular to a longitudinal axis of said fixture blades.

28. The apparatus of claim 27, wherein the other of said lever bars is moved in a second direction opposite said first direction.

29. The apparatus of claim 28, wherein said upper fixture blades are moved in said first direction, said lower fixture blades are moved in said second direction, said movements occurring concurrently.

30. The apparatus of claim 23, wherein said at least one of said fixture blades is rotated about a pivot axis.

31. A method of releasing an adhered laser bar subsequent to a facet coating operation, comprising the steps of:

separating a plurality of spacers from one another, any two of said spacers being on either side of a laser bar, each said spacer including an upper fixture blade positioned above and movable relative to a lower fixture, each said fixture blade including an opening;

mating a pair of lever bars to said upper and lower fixture blades, each said lever bar including a plurality of pins, each of said pins mating with each of said openings; and moving one of said lever bars in a first direction, thereby moving at least one of said fixture blades in said first direction.

32. The method of claim 31, wherein said first direction is along a longitudinal axis of said fixture blades.

33. The method of claim 32, wherein the other of said lever bars is moved in a second direction opposite said first direction.

34. The method of claim 33, wherein said upper fixture blades are moved in said first direction, said lower fixture blades are moved in said second direction, said movements occurring concurrently.

35. The method of claim 31, wherein said first direction is perpendicular to a longitudinal axis of said fixture blades.

36. The method of claim 35, wherein the other of said lever bars is moved in a second direction opposite said first direction.

37. The method of claim 36, wherein said upper fixture blades are moved in said first direction, said lower fixture blades are moved in said second direction, said movements occurring concurrently.

38. The method of claim 31, wherein said at least one of said fixture blades is rotated about a pivot axis.

* * * * *